United States Patent [19]
Barber et al.

[11] Patent Number: 5,241,447
[45] Date of Patent: Aug. 31, 1993

[54] MAGNETIC SWITCH STRUCTURE AND METHOD EMPLOYING SUPERCONDUCTIVE MATERIAL

[75] Inventors: John P. Barber, Dayton; Neal D. Clements, Mt. Orab; Russell L. Spyker, Dayton, all of Ohio

[73] Assignee: The United States of America as represented by the Secretary of the Air Force, Washington, D.C.

[21] Appl. No.: 661,213

[22] Filed: Feb. 27, 1991

[51] Int. Cl.$^5$ ............ H03K 3/38; H03K 17/92; H01F 36/00
[52] U.S. Cl. ............ 361/141; 307/245; 307/306; 323/360; 336/DIG. 1; 361/19; 361/58
[58] Field of Search ............ 307/306, 245, 462; 323/360; 336/DIG. 1; 361/19, 58, 141; 335/216; 338/32 S

[56] References Cited

U.S. PATENT DOCUMENTS

| | | | |
|---|---|---|---|
| 720,884 | 2/1903 | Burgess et al. | 323/331 |
| 2,946,030 | 7/1960 | Slade | 307/245 |
| 3,091,702 | 5/1963 | Slade | 307/245 |
| 3,443,255 | 5/1969 | Massar | 336/58 |
| 3,764,828 | 10/1973 | Croso et al. | 307/306 |
| 4,045,823 | 8/1977 | Parton | 361/58 |
| 4,117,524 | 9/1978 | Parton et al. | 361/19 |
| 4,257,080 | 3/1981 | Bartram et al. | 361/19 |
| 4,897,558 | 1/1990 | Tidman | 307/245 |
| 4,942,378 | 7/1990 | Barber | 335/216 |

OTHER PUBLICATIONS

"A new power system fault limiter", Electrical Review International, Feb., 1978.
Power circuit breaker theory and design, Institution of Electrical Engineers, Peter Peregrinus Ltd.

*Primary Examiner*—Jeffrey A. Gaffin
*Assistant Examiner*—Richard T. Elms
*Attorney, Agent, or Firm*—Thomas L. Kundert; Donald J. Singer

[57] ABSTRACT

An electrical switch structure which employs superconductive material. A magnetizable core is encompassed by a body of superconductive material. The body of superconductive material has a superconductive state and a normal resistive state and can be placed in either state. The magnetizable core is also encompassed by at least one electrically conductive winding through which electrical current flows to create a magnetic flux within the magnetizable core. When the body of superconductive material is in its superconductive state current is induced therein by the magnetic flux in the magnetizable core. Current flow in the body of superconductive creates a magnetic flux in the magnetizable core which cancels the magnetic flux which is created by current flow in the electrically conductive winding. Thus, the state of the body of superconductive material determines the magnetic flux conditions in the magnetizable core, and thus current flow in a winding which encompasses the magnetizable core is controlled by controlling the state of the body of superconductive material.

5 Claims, 1 Drawing Sheet

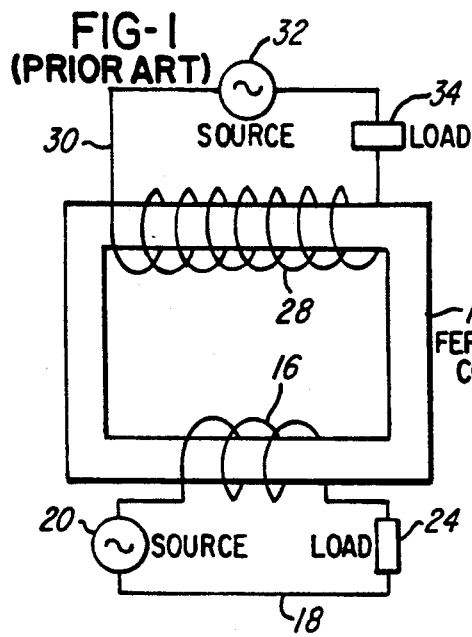
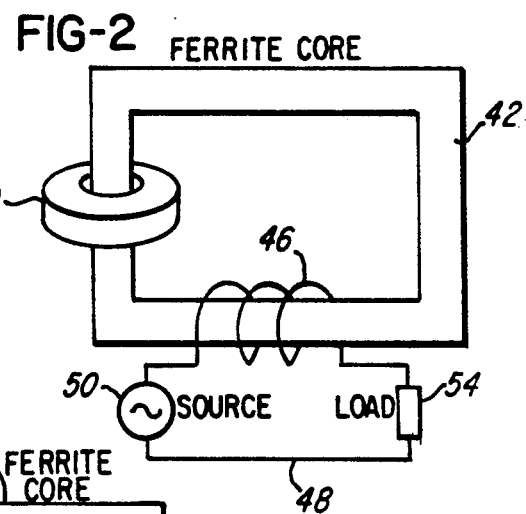
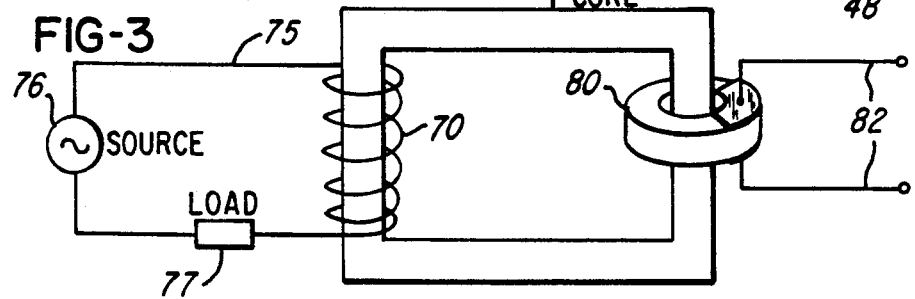
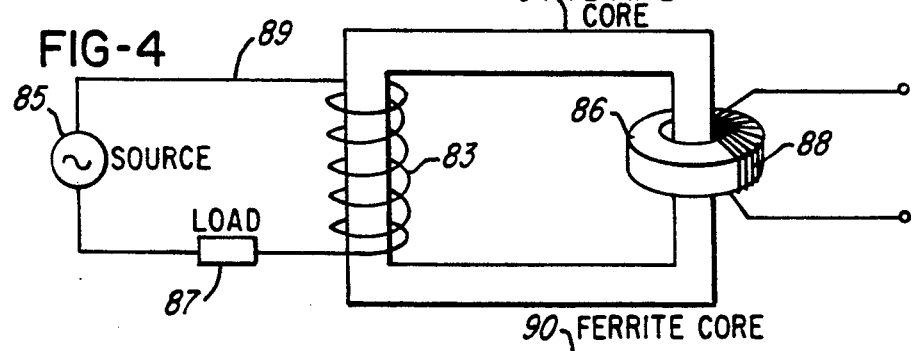
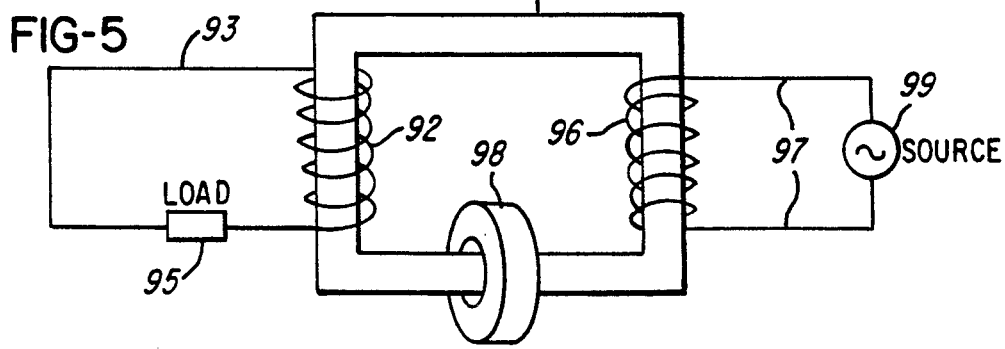

MAGNETIC SWITCH STRUCTURE AND METHOD EMPLOYING SUPERCONDUCTIVE MATERIAL

This invention was made with Government support under contract F33615-89-C-2941 awarded by the Department of the Air Force. The Government has certain rights in the invention.

BACKGROUND OF THE INVENTION

A conventional magnetic switch comprises an annular ferrite core. A first winding is wound around the ferrite core. A source of alternating current electrical energy is applied to the first winding. A second winding is also wound upon the ferrite core. The second winding is connected to a source of alternating current electrical energy and is also connected to an electrical load. When the current flow through the first winding is less than a predetermined magnitude, the reactance in the second winding created by the ferrite core is sufficient to prevent current flow through the second winding.

When alternating current which flows through the first winding is of sufficient magnitude, the ferrite core is magnetically saturated. Thus, there is minimum reactance in the second winding, and current flows through the second winding and through the electrical load. Thus, switching of current flow through the electrical load is controlled by control of current flow through the first winding.

There are several disadvantages in such switching structure and operation. One disadvantage is that the first winding, which is the control winding, and the second winding are directly coupled. Therefore, changes in voltages in the second winding induce voltages in the first winding. Thus, the stability of the switch is adversely affected. Another disadvantage in this switching structure pertains to the numerous turns which are necessary in the first winding to create core saturation with small magnitudes of electrical current. Thus, switching speed is severely limited.

An object of this invention is to provide magnetic switch structure which is capable of high speed operation.

Another object of this invention is to provide magnetic switch structure which can be operated by any one of the plurality of methods.

Another object of this invention is to provide electric switch structure which is capable of control of large or small magnitudes of electrical current without the use of movable contact elements.

Other objects and advantages of this invention reside in the construction of parts, the combination thereof, the method of production and the mode of operation, as will become more apparent from the following description.

SUMMARY OF THE INVENTION

Magnetic switch structure of this invention comprises a magnetizable core and means for creating a first magnetic flux in the magnetizable core. A body of superconductive material is positioned to have current induced therein by the first magnetic flux. The body of superconductive material is also positioned to induce magnetic flux in the magnetizable core when current flows in the body of superconductive material. The body of superconductive material can be placed in a superconductive state and can also be placed in a normal resistive state. Means are provided for selectively placing the body of superconductive material either in its superconductive state or its resistive state.

When the body of superconductive material is in its superconductive state, significant magnitudes of current are induced in the body of superconductive material by the first magnetic flux. The magnetic flux created in the magnetizable core by current flow in the body of superconductive material opposes the first magnetic flux in the magnetizable core. Therefore, cancellation of the magnetic flux in the magnetizable core occurs.

When the body of superconductive material is in its resistive state the first magnetic flux is not cancelled. This action of cancellation or non-cancellation of the magnetic flux in the magnetizable core is employed in embodiments of this invention.

In the one embodiment of this invention, an electrical winding encompasses the magnetizable core and is included in an electrical load circuit. When the body of superconductive material is in its superconductive state impedance in the electrical winding is low, and current flows in the electrical winding. Thus, the circuit through the electrical winding and the electrical load circuit is in an "on" state. Also, in this embodiment, when the body of superconductive material is in its normal or resistive state, no current or a limited magnitude of current is induced in the body of superconductive material and blocking of the magnetic flux in the magnetizable core does not occur or is minimal. Therefore, the magnetic flux in the magnetizable core is sufficient to create a significant reactance in the electrical winding. Thus, there is no current flow through the electrical winding. Therefore, the electrical load circuit is in an "off" state.

In another embodiment of this invention, a first winding and second winding encompass a magnetizable core. A body of superconductive material also encompasses the magnetizable core. Control current flows through the first winding and induces a magnetic flux in the magnetizable core. When the body of superconductive material is in its superconductive state, significant current flows in the body of superconductive material, and a magnetic flux is created in the magnetizable core which cancels the magnetic flux which is generated by current in the first winding. Therefore, no effective magnetic flux exists in the magnetizable core, and there is no current induced in the second winding. When the body of superconductive material is in its resistive state, magnetic flux created by the first winding induces a current in the second winding.

BRIEF DESCRIPTION OF THE VIEWS OF THE DRAWING

FIG. 1 is a diagrammatic view illustrating prior art magnetic switch structure.

FIG. 2 is a diagrammatic view illustrating generally magnetic switch structure of this invention.

FIG. 3 is a diagrammatic view illustrating another embodiment of magnetic switch structure constructed in accordance with this invention.

FIG. 4 is a diagrammatic view illustrating still another embodiment of magnetic switch structure constructed in accordance with this invention.

FIG. 5 is a diagrammatic view of another embodiment of the magnetic switch structure of this invention.

DETAILED DESCRIPTION OF THE PREFERRED EMBODIMENT

FIG. 1 illustrates prior art magnetic switch structure having a ferrite core 12. Encompassing a portion of the ferrite core 12 is a load winding 16. The load winding 16 is part of an electric circuit 18 which includes a source of alternating current electrical energy 20 and an electrical load 24. Also, encompassing the ferrite core 12 is a control winding 28 which is part of an electric circuit 30 which includes a source of electrical energy 32. Also, within the electric circuit 30 is a control element 34 for control of the magnitude of current flow in the electric circuit 30.

When an electrical current of a predetermined magnitude flows through the control winding 28, the ferrite core 12 becomes magnetically saturated. Thus, there is no significant impedance created in the load winding 16, and current flows through the load winding 16 and the electrical load 24. Thus, the electric circuit 18 is in the "on" state.

When electrical current does not flow through the control winding 28, impedance created in the load winding 16 by magnetic flux in the ferrite core 12 reduces flow of current through the load winding 16 and through the electrical load 24. Thus, the electric circuit 18 is in the "off" state.

As stated above, there are several disadvantages in the prior art switch structure shown in FIG. 1. The control winding 28 and the load winding 16 are directly coupled through the ferrite core 12. Thus, voltage changes in the load winding 16 induce voltages in the control winding 28. Therefore, stability in the prior art switch structure of FIG. 1 is adversely affected. Another disadvantage in the prior art magnetic switch structure shown in FIG. 1 pertains to the numerous turns which are necessary in the control winding 28 to create magnetic saturation in the ferrite core 12. Thus, switching speed is severely limited in the prior art magnetic switch structure shown in FIG. 1.

The magnetic switch structure of this invention illustrated in FIGS. 2, 3, 4, and 5 overcomes the disadvantages of the prior art magnetic switch structure.

FIG. 2 illustrates an embodiment of the electric switch structure of this invention. A magnetizable core in the form of a ferrite core 42 has a portion thereof encompassed by a load coil or winding 46. The load winding 46 is a part of an electrical circuit 48, which includes a source of electrical energy 50 and an electrical load 54. The electrical load 54 may be any type of electrical load, such as an electrical resisitive load, or an electric motor, or the like.

Magnetic flux is generated within the ferrite core 42 by current flow through the load winding 46.

Also, encompassing the ferrite core 42 is an annular body 60 of superconductive material. When the annular body 60 is in its superconductive state, current is induced therein by the magnetic flux in the ferrite core 42. The current induced in the annular body 60 generates a magnetic flux in the ferrite core 42 which opposes the magnetic flux generated by current in the load winding 46. Therefore, cancellation or blocking of the magnetic flux within the ferrite core 42 occurs. Thus, the reactance in the load winding 46 is low. Therefore current flows through the load winding 46 and through the electrical load 54. Thus, the switch circuit 48 is in the "on" state.

When the annular body 60 of superconductive material is in its normal or resistive state, blocking or cancellation of magnetic flux in the ferrite core 42 is minimal. Thus, the magnetic flux in the ferrite core 42 creates a reactance in the load winding 46 which prevents current flow through the load winding 46 and through the electrical load 54. Thus, the switch circuit 66 is in an "off" state.

The annular body of superconductive material is maintained in its superconductive state when the temperature of the body of superconductive material is below its transition temperature and when the magnetic field within which the body of superconductive material is positioned is below its critical value and when electric current flow in the body of superconductive material is below its critical value.

There are several methods by which the annular body 60 of superconductive material is placed in its normal resistive state. One method of placing the annular body 60 of superconductive material in its normal resistive state is that of placing the annular body in a temperature environment which is above its transition temperature. Another method of placing the body 60 of superconductive material in its normal resistive state is positioning the body 60 of superconductive material in a magnetic field which is above the critical value of the body 60 of superconductive material. Another method of placing the body 60 of superconductive material in its normal resistive state is that of creating current flow through the body 60 of superconductive material which current is above the critical value of the body of superconductive material.

Another method of placing a body of superconductive material in its normal resistive state relates to the teachings disclosed in U.S. Pat. No. 4,942,378, in which the inventor therein is one of the inventors herein. U.S. Pat. No. 4,942,378 is incorporated herein by reference. A magnetic switch structure employing the teachings of U.S. Pat. No. 4,942,378 is illustrated in FIG. 3.

FIG. 3 shows a load winding 70 which encompasses a portion of a magnetizable element in the form of a ferrite core 74. The load winding 70 is part of a switch circuit 75 which includes a source of electrical energy 76 and an electrical load 77. Also, encompassing the ferrite core 74 is an annular body 80 of superconductive material. Preferably, the annular body of superconductive material is anisotropic. Thus, the critical current density through the annular body 80 is high only within a primary current conduction plane. The annular body 80 has a primary current conduction plane which encompasses the ferrite core 74. Control conductors 82 are connected to the annular body 80 of superconductive material for flow of current therethrough at an angle with respect to the primary current conduction plane. Preferably, the control conductors 82 conduct current through the annular body 80 at an angle substantially normal to the primary conduction plane. The control conductors 82 are connected to a source of electrical energy, not shown.

In accordance with the teachings of U.S. Pat. No. 4,942,378, when there is current flow through the control conductors 82, the annular body 80 becomes substantially normal and resistive. Thus, there is no current flow in the primary conduction plane and cancellation of the magnetic flux in the ferrite core 74 is minimal or negligible. Therefore, the permeability in the ferrite core is high, and magnetic flux in the ferrite core 74 is sufficient to create a reactance in the load winding 70 which prevents current flow through the load winding 70. Thus, the switch circuit 75 is in its "off" state.

When there is no current flow through the control conductors 82, the ferrite core 74 is in its superconductive state. Magnetic flux which is generated in the ferrite core 74 induces current flow in the annular body 80 of superconductive material. When this situation exists, magnetic flux in the ferrite core 74 which is generated by current flow in the load winding 70 is cancelled, and permeability of the ferrite core 74 is negligible. Thus, reactance in the load winding 70 is low and maximum current flows through the load winding 70 and through the switch circuit 75. Thus, the switch circuit 75 is in the "on" state.

FIG. 4 illustrates another embodiment of the magnetic switch structure of this invention. A load winding 83 encompasses a portion of a ferrite core 84. The load winding 83 is part of a load circuit 89 which includes a source of electrical energy 85 and an electrical load 87. Also, encompassing a portion of the ferrite core 84 is an annular body 86 of superconductive material. Encompassing a portion of the annular body 86 of superconductive material is a control winding 88. The primary current conduction plane in the body 86 encompasses the ferrite core 84.

When the annular body 86 of superconductive material is maintained below its transition temperature and when the magnetic field therein is below a critical value, there is resistance to current flow in the primary current conduction plane when there is flow of current through the control winding 88. This is due to the fact that current in the control winding 88 induces currents in the annular body 86 of superconductive material which are at an angle with respect to the primary current conduction plane in the annular body 86. Thus, in accordance with the teachings of U.S. Pat. No. 4,942,378, the annular body 86 of superconductive material becomes substantially normal and resistive. Thus, magnetic flux in the ferrite core 84 is significant. Thus, the magnetic flux in the ferrite core 84 is sufficient to create a reactance in the load winding 83 which prevents current flow through the load winding 83. Thus, the load circuit 89 is in its "off" state.

When there is no current flow through the control winding 88, the annular body 86 of superconductive material is in its superconductive state, and a significant magnitude of current is generated in the annular body 86 by current flow through the load winding 83. When this condition exists, magnetic flux in the ferrite core 84 is cancelled. Thus, reactance in the load winding 83 is low, and maximum current flows through the load winding 83. Thus, the switch circuit 89 is in the "on" state.

FIG. 5 illustrates another embodiment of the magnetic switch structure of this invention. A magnetizable core 90 is encompassed by a load winding 92 which is part of an electric switch circuit 93 which includes an electrical load 95.

Also, encompassing the magnetizable core 90 is a control winding 96. Electrical conductors 97 connect the control winding 96 to a source of electrical energy 99. Also, encompassing the magnetic core 90 is an annular body 98 of superconductive material. The body of superconductive material may be placed in its superconductive state or its resistive state by any of the means or methods described above.

Electric current flows through the control winding 96 and generates magnetic flux within the magnetizable core 90.

When the annular body 98 of superconductive material is in its superconductive state, current is induced in the annular body 98 by magnetic flux within the magnetizable core 90. The current induced in the body 98 of superconductive material completely cancels the magnetic flux generated by the current in the control winding 96. Therefore, there is no effective magnetic flux in the magnetizable core 90, and no current is generated in the load winding 92 and no current flows in the electric switch circuit 93.

When the annular body 98 is in its resistive state the magnetic flux generated in the magnetizable core 90 by current flow in the control winding 96 is not cancelled. Therefore, by the transformer action in the magnetizable core 90, a voltage is generated across the load winding 92 and current flows in the switch circuit 93.

Thus, it is understood that the magnetic switch structure and method of this invention are capable of efficient, effective, and rapid switching of current flow.

Although the preferred embodiment of the magnetic switch structure and method of this invention has been described, it will be understood that within the purview of this invention various changes may be made in the form, details, proportion and arrangement of parts and elements, the combination thereof, and the mode of operation, which generally stated consist in a magnetic switch structure within the scope of the appended claims.

The invention having thus been described, the following is claimed:

1. Electrical switch structure comprising a magnetizable core, an electrical switch circuit which includes an electrically conductive winding and a source of electrical energy, the electrically conductive winding encompassing a portion of the magnetizable core, whereby electrical current flowing in the electrically conductive winding creates a first magnetic flux in the magnetizable core, a body of superconductive material encompassing a portion of the magnetizable core, the body of superconductive material having a superconductive state and a resistive state, the body of superconductive material including a primary current conduction plane, the electrical switch structure including means for conducting electrical current through the body of superconductive material in a direction angular with respect to the primary current conduction plane, whereby the body of superconductive material is placed in a resistive state when electrical current flows through the body of superconductive material in a direction angular with respect to the primary current conduction plane, whereby when the body of superconductive material is in its superconductive state current is induced therein by the first magnetic flux and whereby current flow in the body of superconductive material creates a second magnetic flux within the magnetizable core and the second magnetic flux cancels the first magnetic flux, whereby reactance within the electrically conductive winding is negligible and current flows through the electrically conductive winding, and whereby the electrical switch circuit is in its "on" state, and whereby when the body of superconductive material is in its resistive state no significant current is generated in the body of superconductive material and reactance within the electrically conductive winding prevents current flow in the electrical switch circuit and whereby the electrical switch circuit is in its "off" state.

2. Electrical switch structure comprising a magnetizable core, an electrical switch circuit which includes an electrically conductive winding and a source of electrical energy, the electrically conductive winding encompassing a portion of the magnetizable core, whereby electrical current flowing in the electrically conductive winding creates a first magnetic flux in the magnetizable core, a body of superconductive material encompassing a portion of the magnetizable core, the body of superconductive material having a superconductive state and a resistive state, the body of superconductive material including a primary current conduction plane, the electrical switch structure also including electric circuit means encompassing a portion of the body of superconductive material, whereby current flow through the electric circuit means induces current in the body of superconductive material in a direction angular with respect to the primary current conduction plane, whereby the body of superconductive material is placed in a resistive state when current flows through the electric circuit means, whereby when the body of superconductive material is in its superconductive state current is induced therein by the first magnetic flux and whereby current flow in the body of superconductive material creates a second magnetic flux within the magnetizable core and the second magnetic flux cancels the first magnetic flux, whereby reactance within the electrically conductive winding is negligible and current flows through the electrically conductive winding, and whereby the electrical switch circuit is in its "on" state, and whereby when the body of superconductive material is in its resistive state no significant current is generated in the body of superconductive material and reactance within the electrically conductive winding prevents current flow in the electrical switch circuit and whereby the electrical switch circuit is in its "off" state.

3. Electrical switch structure comprising a magnetizable core, an electrically conductive winding encompassing a portion of the magnetizable core, whereby flow of current through the electrically conductive winding creates a first magnetic flux in the magnetizable core, a body of superconductive material encompassing a portion of the magnetizable core, the body of superconductive material having a superconductive state and a resistive state, the body of superconductive material including a primary current conduction plane, means for conducting electrical current through the body of superconductive material in a direction angular with respect to the primary current conduction plane, whereby the body of superconductive material is placed in a resistive state when electrical current flows through the body of superconductive material in a direction angular with respect to the primary current conduction plane, whereby when the body of superconductive material is in its superconductive state current is induced therein by the first magnetic flux in the magnetizable core, whereby current in the body of superconductive material creates a second magnetic flux within the magnetizable core, whereby the second magnetic flux cancels the first magnetic flux, and whereby when the body of superconductive material is in its resistive state current is not induced in the body of superconductive material and the first magnetic flux is not cancelled.

4. The method of electrically switching an electrical circuit comprising providing a magnetizable core, encompassing the magnetizable core with a portion of a switch circuit, in which the switch circuit includes a source of electrical energy whereby a first magnetic flux is generated within the magnetizable core by flow of electrical current through the portion of the switch circuit which encompasses the magnetizable core, positioning a body of superconductive material in encompassing relationship with respect to the magnetizable core in which the body of superconductive material has a superconductive state and a resistive state, placing the body of superconductive material into its superconductive state, whereby electric current is induced within the body of superconductive material by the first magnetic flux and whereby the electric current within the body of superconductive material creates a second magnetic flux in the magnetizable core and the second magnetic flux cancels the first magnetic flux in the magnetizable core and whereby reactance in said portion of the switch circuit is negligible and current flows in said portion of the switch circuit which encompasses the magnetizable core, and whereby the switch circuit is in an "on" state, the body of superconductive material having a primary current conduction plane, placing the body of superconductive material in its resistive state comprising conducting current through the body of superconductive material in a direction which is angular with respect to the primary current conduction plane, whereby electric current induced in the body of superconductive material is minimal and the first magnetic flux within the magnetizable core creates reactance with the portion of the switch circuit which encompasses the magnetizable core and no significant current flows in the portion of the switch circuit which encompasses the magnetizable core and whereby the switch circuit is in an "off" state.

5. The method of electrically switching an electrical circuit comprising providing a magnetizable core, encompassing the magnetizable core with a portion of a switch circuit, in which the switch circuit includes a source of electrical energy whereby a first magnetic flux is generated within the magnetizable core by flow of electrical current through the portion of the switch circuit which encompasses the magnetizable core, positioning a body of superconductive material in encompassing relationship with respect to the magnetizable core in which the body of superconductive material has a superconductive state and a resistive state, placing the body of superconductive material into its superconductive state, whereby electric current is induced within the body of superconductive material by the first magnetic flux and whereby the electric current within the body of superconductive material creates a second magnetic flux in the magnetizable core and the second magnetic flux cancels the first magnetic flux in the magnetizable core and whereby reactance in said portion of the switch circuit is negligible and current flow in said portion of the switch circuit which encompasses the magnetizable core, and whereby the switch circuit is in an "on" state, the body of superconductive material having a primary current conduction plane, placing the body of superconductive material in its resistive state comprising encompassing the body of superconductive material with an electric current conductor, following by creating current flow through the electric current conductor, whereby electric current flow is induced within the body of superconductive material in a direction angular with respect to the primary current conduction place and whereby the body of superconductive material is placed in its resistive state, whereby electric current induced in the body of superconductive material is minimal and the first magnetic flux within the magnetizable core creates reactance with the portion of the switch circuit which encompasses the magnetizable core and no significant current flows in the portion of the switch circuit which encompasses the magnetizable core and whereby the switch circuit is in an "off" state.

* * * * *